United States Patent
Yang (10) Patent No.: US 12,531,216 B2
(45) Date of Patent: Jan. 20, 2026

(54) SUPPORT UNIT AND SUBSTRATE PROCESSING APPARATUS INCLUDING SAME

(71) Applicant: PSK INC., Hwaseong-si (KR)

(72) Inventor: Yong Soo Yang, Hwaseong-si (KR)

(73) Assignee: PSK INC., Hwaseong-si (KR)

( * ) Notice: Subject to any disclaimer, the term of this patent is extended or adjusted under 35 U.S.C. 154(b) by 429 days.

(21) Appl. No.: 18/040,341

(22) PCT Filed: Jan. 4, 2022

(86) PCT No.: PCT/KR2022/000079
§ 371 (c)(1),
(2) Date: Feb. 2, 2023

(87) PCT Pub. No.: WO2023/096023
PCT Pub. Date: Jun. 1, 2023

(65) Prior Publication Data
US 2025/0095972 A1    Mar. 20, 2025

(30) Foreign Application Priority Data

Nov. 23, 2021   (KR) ........................ 10-2021-0162011

(51) Int. Cl.
*H01J 37/32*          (2006.01)
(52) U.S. Cl.
CPC .... *H01J 37/32697* (2013.01); *H01J 37/3244* (2013.01); *H01J 37/32724* (2013.01); *H01J 2237/002* (2013.01); *H01J 2237/0044* (2013.01)

(58) Field of Classification Search
CPC ............ H01J 37/32697; H01J 37/3244; H01J 37/32724; H01J 2237/002;
(Continued)

(56) References Cited

U.S. PATENT DOCUMENTS 4,747,450 A * 5/1988 Ikegame ................ H01L 23/473
                                                             257/E23.098
5,376,213 A * 12/1994 Ueda ................. H01L 21/67126
                                                             156/345.53
(Continued)

FOREIGN PATENT DOCUMENTS

CN          112951695 A      6/2021
JP         2002-514010 A     5/2002
(Continued)

OTHER PUBLICATIONS

Office Action issued Aug. 19, 2023, in Korean Application No. 10-2021-0162011.
(Continued)

*Primary Examiner* — Rudy Zervigon
(74) *Attorney, Agent, or Firm* — Sughrue Mion, PLLC (57) ABSTRACT

The present disclosure provides a substrate processing apparatus. The substrate processing apparatus includes a chamber defining a processing space, a gas supply unit supplying a process gas to the processing space, and a support unit supporting a substrate in the processing space, wherein the support unit includes a chuck supporting the substrate, a power applying RF power to the chuck, and an ionization path through which static electricity generated in the chuck is removed.

11 Claims, 5 Drawing Sheets

(58) Field of Classification Search
CPC ............... H01J 2237/0044; H01J 37/32; H01J 37/32174; H01J 37/32577; H01J 15/00; H01J 37/32091; H01J 37/32082; H01J 37/32623; H01J 37/32009; H01J 37/32532; H01J 37/32018; H01J 37/32027; H01J 37/32036; H01L 21/67; H01L 21/687; H01L 21/68714; H01L 21/67069; C23C 16/507; C23C 16/509; C23C 16/5096; C23C 16/45565
USPC ..... 118/723 E, 723 ER; 156/345.43, 345.44, 156/345.45, 345.46, 345.47; 269/1; 279/1
See application file for complete search history.

(56) References Cited

U.S. PATENT DOCUMENTS

| | | | |
|---|---|---|---|
| 5,838,528 A * | 11/1998 | Os | ........................ H02N 13/00 279/128 |
| 6,081,414 A | 6/2000 | Flanigan et al. | |
| 7,535,688 B2 | 5/2009 | Yokouchi et al. | |
| 11,462,431 B2 | 10/2022 | Arakane et al. | |
| 2005/0236111 A1 | 10/2005 | Higashiura | |
| 2008/0236492 A1 | 10/2008 | Yamazawa | |
| 2010/0096084 A1* | 4/2010 | Lee | ................... H01L 21/67069 156/345.43 |
| 2014/0034612 A1* | 2/2014 | Yang | ................. H01L 21/67109 216/71 |
| 2021/0343512 A1 | 11/2021 | Parkhe et al. | |
| 2022/0157565 A1* | 5/2022 | Kim | .................... H01J 37/3244 |

FOREIGN PATENT DOCUMENTS

| | | |
|---|---|---|
| JP | 2006-269854 A | 10/2006 |
| JP | 2008-244063 A | 10/2008 |
| KR | 10-2007-0033221 A | 3/2007 |
| KR | 10-2008-0001336 A | 1/2008 |
| KR | 10-2009-0121251 A | 11/2009 |
| KR | 10-2020-0125467 A | 11/2020 |
| TW | 202121487 A | 6/2021 |

OTHER PUBLICATIONS

Office Action issued Jun. 8, 2023, in Taiwanese Application No. 111102539.

Korean Office Action dated Feb. 26, 2024 in Application No. 10-2021-0162011.

International Search Report for PCT/KR2022/000079, dated Aug. 22, 2022.

* cited by examiner

SUPPORT UNIT AND SUBSTRATE PROCESSING APPARATUS INCLUDING SAME

CROSS REFERENCE TO RELATED APPLICATIONS

This application is a National Stage of International Application No. PCT/KR2022/000079 filed Jan. 4, 2022, claiming priority based on Korean Patent Application No. 10-2021-0162011, filed Nov. 23, 2021, the disclosures of which are incorporated herein by reference in their entireties.

TECHNICAL FIELD

The present disclosure relates to a support unit, and a substrate processing apparatus including the same, and more particularly, to a support unit that a substrate processing apparatus using plasma has, and the substrate processing apparatus.

BACKGROUND ART

Plasma refers to an ionized gas state consisting of ions, radicals, electrons, and the like, and is generated by a very high temperature, a strong electric field, or RF electromagnetic fields. A semiconductor device manufacturing process includes an ashing or etching process of removing a film material on a substrate by using plasma. The ashing or etching process is performed as ions and radical particles included in plasma collide with or react the film material on the substrate. A process of processing a substrate by using plasma is performed by various methods.

Generally, to generate the above-described plasma, a substrate processing apparatus has an RF power source for generating RF electromagnetic fields. The RF power source generates plasma by forming RF electromagnetic fields in a space in a chamber. The RF power source is connected to a chuck for supporting a substrate such as a wafer and the like in a space in a chamber. The chuck is provided as a metal material. RF discharge is generated in the space in the chamber by RF power applied by the RF power source. The chuck is surrounded by an insulator (so called, isolation).

To uniformly perform the processing on the substrate, a temperature of the chuck supporting the substrate is maintained at a set temperature. To this end, provided is a chiller for supplying a cooling fluid through a flow path formed in the chuck. The chiller maintains the temperature of the chuck at the set temperature by supplying the cooling fluid through the flow path formed in the chuck and collecting the cooling fluid from the flow path. However, as such, when the chuck is cooled by supplying the cooling fluid through the flow path formed in the chuck, static electricity is generated by friction between the cooling fluid and the chuck or friction between the cooling fluid and a pipe through which the cooling fluid is transferred to the flow path. The generated static electricity is accumulated in the chuck.

As the static electricity is accumulated in the chuck, a problem such as arcing and the like may be generated. Accordingly, a method of connecting a ground line to a chuck may be considered to remove static electricity accumulated in the chuck. However, to generate the above-described RF discharge, the chuck needs to be isolated, that is, electrically insulated. In other words, when a ground line for forming an ionization path is connected to a chuck, the above-described RF discharge is difficult to be generated.

DESCRIPTION OF EMBODIMENTS

Technical Problem

It is an objective of the present disclosure to provide a support unit and a substrate processing apparatus, which may efficiently process a substrate.

Furthermore, it is another objective of the present disclosure to provide a support unit and a substrate processing apparatus, which may remove static electricity that may be accumulated in a chuck.

Furthermore, it is another objective of the present disclosure to provide a support unit and a substrate processing apparatus, which may provide an ionization path for removing static electricity accumulated in a chuck, and reduce lowering of the RF discharge efficiency of a chuck due to the ionization path.

The technical objectives to be achieved by the present disclosure are not limited to the above-described objectives, and other technical objectives that are not mentioned herein would be clearly understood by a person skilled in the art from the description of the present disclosure.

Solution to Problem

The present disclosure provides a substrate processing apparatus. The substrate processing apparatus includes a chamber defining a processing space, a gas supply unit supplying a process gas to the processing space, and a support unit supporting a substrate in the processing space, wherein the support unit includes a chuck supporting the substrate, a power applying RF power to the chuck, and an ionization path through which static electricity generated in the chuck is removed.

According to an embodiment, the substrate processing apparatus may further include a ground member forming the ionization path, and having an impedance greater than an impedance of the chamber.

According to an embodiment, the ground member may include a ground line, and a ground resistor installed on the ground line.

According to an embodiment, the support unit may include a temperature control member controlling a temperature of the chuck.

According to an embodiment, the temperature control member may include a fluid supply source supplying a fluid to control a temperature of the chuck, and a fluid line through which the fluid is transferred to a flow path in the chuck, a second line of the fluid line may be provided as an insulating pipe, and a first line of the fluid line may be provided as a conductive pipe.

According to an embodiment, the second line may be a pipe adjacent to the chuck of the chuck and the fluid supply source, and the first line may be a pipe adjacent to the fluid supply source of the chuck and the fluid supply source.

According to an embodiment, an impedance of the second line may be greater than an impedance of the ground member.

According to an embodiment, the support unit may further include an isolator surrounding at least part of the chuck and provided as an insulating material.

According to an embodiment, the chamber may further include a housing, and a gas baffle combined with the housing to define the processing space, and in which at least one perforation is formed through which the process gas supplied by the gas supply unit passes.

According to an embodiment, the gas baffle may have an impedance that is less than an impedance of the ground member.

Also, the present disclosure provides a support unit in a chamber for processing a substrate by using plasma. The support unit includes a chuck supporting the substrate, an RF load applying RF power to the chuck, a ground member forming an ionization path through which static electricity generated in the chuck is removed, and a temperature control member controlling a temperature of the chuck.

According to an embodiment, the temperature control member may include a fluid supply source supplying a fluid to control a temperature of the chuck, and a fluid line through which the fluid is transferred to a flow path in the chuck, and at least part of the fluid line may be provided as an insulating pipe.

According to an embodiment, the fluid line may include a supply line through which the fluid is supplied to the flow path, and a collection line through which the fluid is collected from the flow path.

According to an embodiment, the supply line may include a first supply line connected to the chuck and provided as an insulating material, and a second supply line connected to the fluid supply source and provided as a conductive material, and the collection line may include a first collection line connected to the chuck and provided as an insulating material, and a second collection line connected to the fluid supply source and provided as a conductive material.

According to an embodiment, the ground member may have an impedance greater than an impedance of the chamber that defines a processing space in which the substrate is processed.

According to an embodiment, the ground member may include a ground line—the ground line being electrically connected to a ground—, and a ground resistor on which the ground line is installed, and the ground resistor may have an impedance greater than an impedance of the chamber.

According to an embodiment, the ground resistor may have a resistance of 3 M Ω/sq to 4 M Ω/sq.

Advantageous Effects of Disclosure

According to an embodiment of the present disclosure, a substrate may be efficiently processed.

Furthermore, according to an embodiment of the present disclosure, static electricity to be accumulated in a chuck may be removed.

Furthermore, according to an embodiment of the present disclosure, an ionization path for removing the static electricity accumulated in the chuck is provided, and lowering of the RF discharge efficiency of the chuck due to the ionization path may be reduced.

The effects of the present disclosure are not limited to the above-described effects, and other various effects that are not described in the specification may be clearly understood from the following descriptions by one skilled in the art to which the present disclosure belongs.

MODE OF DISCLOSURE

The disclosure will now be described more fully with reference to the accompanying drawings, in which embodiments of the disclosure are shown. However, this is not intended to limit the disclosure to particular modes of practice, and it is to be appreciated that all changes, equivalents, and substitutes that do not depart from the spirit and technical scope of the disclosure are encompassed in the disclosure. In the description of the disclosure, certain detailed explanations of the related art are omitted when it is deemed that they may unnecessarily obscure the essence of the disclosure. Furthermore, throughout the drawings, like reference numerals are used for portions having similar functions and operations.

When a part may "include" a certain constituent element, unless specified otherwise, it may not be construed to exclude another constituent element but may be construed to further include other constituent elements. In detail, terms such as "include" or "comprise" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof.

The expression of singularity in the specification includes the expression of plurality unless clearly specified otherwise in context. Also, the structure or size of each element illustrated in the drawings may be exaggerated for convenience of explanation and clarity.

An embodiment of the present disclosure is described below in detail with reference to FIGS. 1 to 5.

Figure 1:
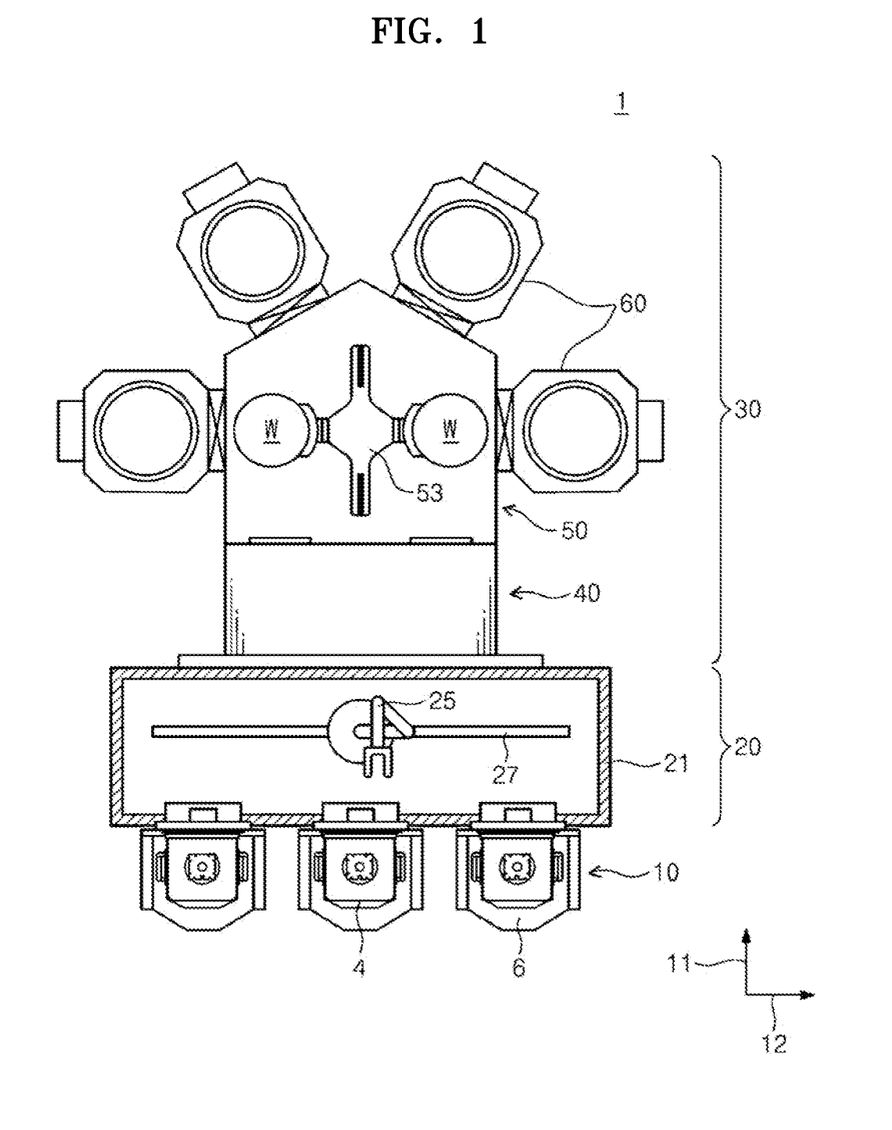
FIG. 1 schematically illustrates substrate processing equipment according to an embodiment of the present disclosure.

FIG. 1 schematically illustrates substrate processing equipment according to an embodiment of the present disclosure. Referring to FIG. 1, substrate processing equipment 1 has an equipment front end module (EFEM) 20 and a processing module 30. The EFEM 20 and the processing module 30 are arranged in one direction.

The EFEM 20 may have a load port 10 and a transfer frame 21. The load port 10 is arranged in front of the EFEM 20 in a first direction 11. The load port 10 may include a plurality of support portions 6. The support portions 6 are arranged in a row in a second direction 12, and a carrier 4 (for example, a cassette, an FOUP, and the like), in which a substrate W to be provided to a process and the substrate W having completed the process are placed, is placed on each of the support portions 6. The substrate W to be provided to a process and the substrate W having completed the process are placed in the carrier 4. The transfer frame 21 is arranged between the load port 10 and the processing module 30. The transfer frame 21 may include a first transfer robot 25 arranged therein and transferring the substrate W between the load port 10 and the processing module 30. The first transfer robot 25 moves along a transfer rail 27 provided in the second direction 12 to transfer the substrate W between the carrier 4 and the processing module 30.

The processing module 30 may include a loadlock chamber 40, a transfer chamber 50, and a plurality of process chambers 60. The processing module 30 may process the substrate W by receiving the substrate W from the EFEM 20.

The loadlock chamber 40 is arranged adjacent to the transfer frame 21. In an example, the loadlock chamber 40 may be arranged between the transfer chamber 50 and the EFEM 20. The loadlock chamber 40 provides a space in which the substrate W waits before the substrate W to be provided to a process is transferred to each of the process chambers 60, or before the substrate W having completed the process is transferred to the EFEM 20.

The transfer chamber 50 may transfer the substrate W. The transfer chamber 50 is arranged adjacent to the loadlock chamber 40. When viewed from the top of the transfer chamber 50, the transfer chamber 50 has a polygonal body. Referring to FIG. 1, when viewed from the top of the transfer chamber 50, the transfer chamber 50 has a pentagonal body. The loadlock chamber 40 and the process chambers 60 are arranged outside the body along the circumference of the body. A path (not shown) through which the substrate W enters and exits is formed in each side wall of the body, and the path connects the transfer chamber 50 to the loadlock chamber 40 or the process chambers 60. Each path is provided with a door (not shown) for sealing the inside of the body by opening/closing the path. A second transfer robot 53 for transferring the substrate W between the loadlock chamber 40 and the process chambers 60 is arranged in an inner space of the transfer chamber 50. The second transfer robot 53 transfers the substrate W that is not processed yet and waits in the loadlock chamber 40 to each of the process chambers 60, to transfers the substrate W having completed the process to the loadlock chamber 40. Furthermore, the second transfer robot 53 may carry the substrate W into a processing space 102 of a housing 100 to be described below, or carry the substrate W out of the processing space 102. Furthermore, the second transfer robot 53 may transfer the substrate W between the process chambers 60 to sequentially provide the substrate W to the process chambers 60. As illustrated in FIG. 1, when the transfer chamber 50 has a pentagonal body, the loadlock chamber 40 is arranged in a side wall adjacent to the EFEM 20, and the process chambers 60 are arranged in the other side walls consecutively. The transfer chamber 50 may be provided not only in the above shape, but also in various shapes according to a desired process module.

The process chambers 60 may be arranged adjacent to the transfer chamber 50. The process chambers 60 are arranged along the circumference of the perimeter of chamber 50. The process chambers 60 may be provided in plural. The substrate W may be processed in each of the process chambers 60. Each of the process chambers 60 receives the substrate W from the second transfer robot 53, performs a process on the received substrate W, and provides the substrate W having completed the process to the second transfer robot 53. The processes performed in the process chambers 60 may be different from each other.

A substrate processing apparatus for performing a plasma process in the process chambers 60 is described in detail. Furthermore, an example in which a substrate processing apparatus described below is configured to perform a plasma processing process on a substrate such as a wafer among the process chambers 60 is described. However, the disclosure is not limited thereto, and a substrate processing apparatus described below may be applied, in the same or similar manner, to various chambers in which a substrate is processed. Furthermore, the substrate processing apparatus may be applied in the same or similar manner to various chambers in which a plasma processing process is performed on a substrate.

Figure 2:
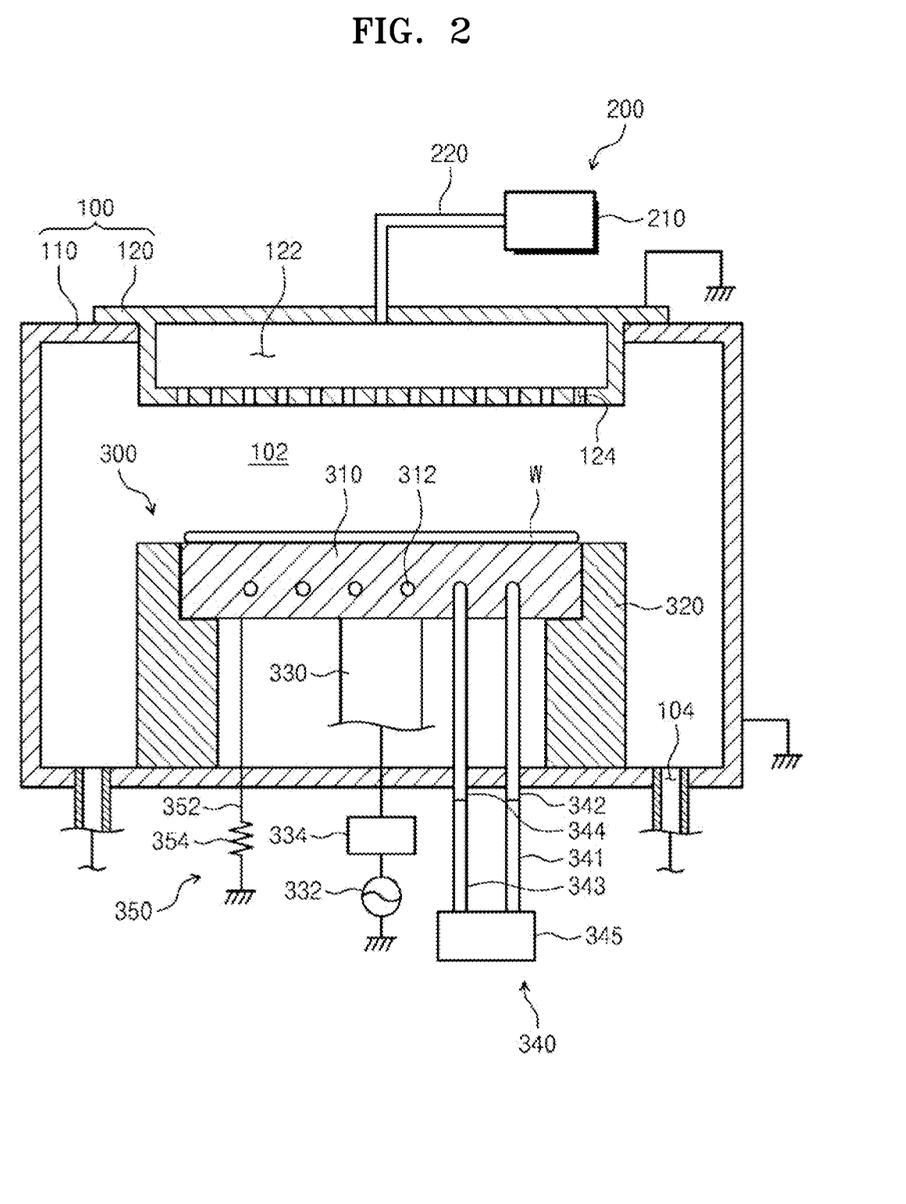
FIG. 2 illustrates an embodiment of a substrate processing apparatus provided to a process chamber of FIG. 1.

FIG. 2 illustrates an embodiment of a substrate processing apparatus provided to the process chambers 60 of FIG. 1. Referring to FIG. 1, a substrate processing apparatus provided to one of the process chambers 60 performs a certain process on the substrate W by using plasma. In an example, the substrate processing apparatus may etch or ash a film material on the substrate W. The film material may be various types of film materials such as a polysilicon film, a silicon oxide film, a silicon nitride film, and the like. Furthermore, the film material may be a natural oxide film or a chemically generated oxide film. Furthermore, the film material may be a by-product generated in a process for processing the substrate W. Furthermore, the film material may be impurities adhering and/or remaining on the substrate W.

The substrate processing apparatus may perform a plasma process on the substrate W. For example, the substrate processing apparatus may supply a process gas G, and process the substrate W by generating plasma from the process gas G that is supplied.

The substrate processing apparatus may include a chamber 100, a gas supply unit 200, a support unit 300, and a controller (not shown).

The chamber 100 may define a processing space 102. The chamber 100 may define the processing space 102 in which the substrate W is processed. At least one discharge hole 104 that may be connected to a decompression member (for example, a pump) for exhausting the atmosphere of the processing space 102 may be formed in a bottom portion of the chamber 100. When the decompression member exhausts the atmosphere of the processing space 102, the process gas G supplied to the processing space 102 and a process by-product generated as the substrate W is processed may be exhausted from the processing space 102. The chamber 100 may be grounded.

The chamber 100 may include a housing 110 and a gas baffle 120. The housing 110 may have a box shape having an open upper portion. The housing 110 may have a box shape having an upper portion that is at least partially open. The housing 110 may be provided as a material including metal. The housing 110 may be grounded. An inner wall of the housing 110 may be coated with a material having high corrosion resistance to plasma P described below. Furthermore, the discharge hole 104 described above may be formed in a bottom portion of the housing 110.

The gas baffle 120 may cover an opening formed in the housing 110. The gas baffle 120 may define the processing space 102 in a combination of the housing 110. The gas baffle 120 may have a plate shape. The gas baffle 120 may have a plate shape in which a gas supply space 122 is formed. At least one perforation 124 may be formed in the gas baffle 120. The gas supply space 122 and the processing space 102 may have a fluid communication with each other via the perforation 124. The gas supply space 122 may be a space in which the gas supply unit 200 described below supplies the process gas G. The process gas G supplied by the gas supply unit 200 may flow into the processing space 102 via the gas supply space 122. The gas baffle 120 may be grounded. The gas baffle 120 may be an example of an upper electrode.

The gas baffle 120 may have a disc shape when viewed from the top. The gas baffle 120 may have a stepped shape such that the height of a lower surface in an edge area is greater that the height of a lower surface in a central area. The central area of the gas baffle 120 may be provided to be inserted into an opening formed in the housing 110. A hole connected to a gas supply line 220 of the gas supply unit 200 described below may be formed in an upper central area of the gas baffle 120.

The gas supply unit 200 may supply the process gas G. The gas supply unit 200 may supply the process gas G excited to a plasma P state. The gas supply unit 200 may supply the process gas G to the processing space 102. The process gas G may include at least one or more of $N_2$, Ar, $H_2$, $O_2$, $CF_4$, and $SF_6$. The gas supply unit 200 may include a gas supply source 210 and the gas supply line 220. The gas supply source 210 may be configured to supply the process gas G containing at least one or more of $N_2$, Ar, $H_2$, $O_2$, $CF_4$, and $SF_6$. The gas supply source 210 may be configured to supply the process gas G to the gas supply space 122. One end of the gas supply line 220 may be connected to the gas supply source 210, and the other end thereof may be connected to the gas baffle 120. The process gas G supplied to the gas supply space 122 via the gas supply line 220 may be supplied to the processing space 102 through the perforation 124.

The support unit 300 may support the substrate W. The support unit 300 may support the substrate W in the processing space 102. The support unit 300 may generate RF discharge in the processing space 102. The support unit 300 may form a high frequency electric field in the processing space 102. The support unit 300 may be a plasma source for generating the plasma P by exciting the process gas G supplied to the processing space 102.

The support unit 300 may include a chuck 310, an isolator 320, an RF load 330, a temperature control member 340, and a ground member 350.

The chuck 310 may support the substrate W. The chuck 310 may be provided as a conductive material. The chuck 310 may be provided as a material including metal. The chuck 310 may have a placement surface on which the substrate W is placed. An upper surface of the chuck 310 may be a placement surface on which the substrate W is placed. The chuck 310 may have a circular shape when viewed from the top. The chuck 310 may be electrically separated from the chamber 100. The chuck 310 may be supported by the isolator 320. Furthermore, a flow path through which a fluid supplied by the temperature control member 340 described below flows may be formed in the chuck 310.

The isolator 320 may be provided to surround the chuck 310. The isolator 320 may surround at least part of the chuck 310 and may be provided as an insulating material. For example, the 320 may be provided as a material including PEEK or ceramic. The isolator 320 may be provided to surround an edge area of the chuck 310 when viewed from the top.

The RF load 330 may apply RF power to the chuck 310. The RF load 330 may supply RF power to the chuck 310. Furthermore, the support unit 300 may further include a power 332 and a matcher 334. The power 332 may apply RF power to the matcher 334. The RF power applied to the matcher 334 may be transferred to the RF load 330. The RF power applied to the RF load 330 may be transferred to the chuck 310. Furthermore, the matcher 334 may perform impedance matching to increase an RF discharge efficiency described below. The chuck 310 may be an example of a lower electrode.

The temperature control member 340 may control the temperature of the chuck 310. The temperature control member 340 may control the temperature of the chuck 310 by supplying a fluid to a flow path 312 formed in the chuck 310. The controller 900 described below may control the temperature control member 340 based on a value of the temperature of the chuck 310 measured by a sensor (not shown) for sensing the temperature of the chuck 310. The temperature of the chuck 310 may be maintained constant at a set temperature by a fluid supplied by the temperature control member 340.

The temperature control member 340 may include a first supply line 341, a second supply line 342, a first collection line 343, a second collection line 344, and a fluid supply source 345. The supply lines 341 and 342 and the collection lines 343 and 344 may be collectively referred to as fluid lines. The first supply line 341 and the second supply line 342 may be pipes through which the fluid supply source 345 supplies a fluid to the flow path 312. The amount of resistance per unit area of the first supply line 341 may be less than the amount of resistance per unit area of the second supply line 342. The second supply line 342 may be provided as an insulating material. The first supply line 341 may be provided as a conductive material. One end of the first supply line 341 may be connected to the fluid supply source 345, and the other end of the first supply line 341 may be connected to the second supply line 342. Furthermore, the first supply line 341 may be electrically grounded. For example, the first supply line 341 may be electrically connected to the fluid supply source 345 that is grounded, to be grounded. Accordingly, static electricity that may be generated as a fluid flows along the first supply line 341 may be removed through the first supply line 341. One end of the second supply line 342 may be connected to the other end of the first supply line 341, and the other end of the second supply line 342 may be connected to the flow path 312 of the chuck 310. In other words, the second supply line 342 may be a pipe adjacent to the chuck 310, and the first supply line 341 may be a pipe adjacent to the fluid supply source 345.

The first collection line 343 and the second collection line 344 may be pipes to collect the fluid supplied to the flow path 312, to the fluid supply source 345. The amount of resistance per unit area of the first collection line 343 may be less than the amount of resistance per unit area of the second collection line 344. For example, the second collection line 344 may be provided as an insulating material. Furthermore, the first collection line 343 may be provided as a conductive material. One end of the first collection line 343 may be connected to the fluid supply source 345, and the other end of the first collection line 343 may be connected to the second collection line 344. Furthermore, the first collection line 343 may be electrically grounded. For example, the first collection line 343 may be electrically connected to the fluid supply source 345 that is grounded, to be grounded. Accordingly, static electricity that may be generated as the fluid flows along the first collection line 343 may be removed through the first collection line 343. One end of the second collection line 344 may be connected to the other end of the first collection line 343, and the other end of the second collection line 344 may be connected to the flow path 312 of the chuck 310. In other words, the second collection line 344 may be a pipe adjacent to the chuck 310, and the first collection line 343 may be a pipe adjacent to the fluid supply source 345.

The first supply line 341 and the first collection line 343 may be provided as a conductive material. As the fluid supplied by the fluid supply source 345 flows along the supply lines 341 and 342, and the collection lines 343 and 344, which are pipes, friction is made generating static electricity. Some of static electricity may be removed through an ionization path formed by the first supply line 341 and the first collection line 343. To this end, the fluid supply source 345 may be grounded.

Furthermore, the second supply line 342 and the second collection line 344 may be provided as an insulating material. As described above, to allow RF discharge to be generated in the processing space 102 by the RF power applied by the power 332, the chuck 310 is electrically separated from the chamber 100. As the second supply line 342 and the second collection line 344 are provided as an insulating material, the chuck 310 may be isolated (electrically separated from the chamber 100).

The fluid supply source 345 may supply the fluid. The fluid supply source 345 may supply the fluid that may control the temperature of the chuck 310. The fluid supply source 345 may supply the fluid that may control the temperature of the chuck 310 to a set temperature. The fluid supplied by the fluid supply source 345 may be a cooling fluid. The fluid supplied by the fluid supply source 345 may be cooling water. However, the disclosure is not limited thereto, and the fluid supplied by the fluid supply source 345 may be a cooling gas such as an inert gas.

The ground member 350 may form an ionization path to remove static electricity that may be accumulated in the chuck 310. The ground member 350 may form an ionization path to remove static electricity that may be generated by the fluid supplied by the temperature control member 340. The amount of impedance that the ground member 350 has may be greater than the amount of impedance that the chamber 100 has. Furthermore, the amount of impedance that the ground member 350 has may be less than the amount of impedance that the second supply line 342 and/or the second collection line 344 has.

The ground member 350 may include a ground line 352 and a ground resistor 354. The ground line 352 may ground the chuck 310. The ground resistor 354 may be installed on the ground line 352. The ground resistor 354 may have high capacity not to affect the RF discharge. The ground resistor 354 may have a resistance of about 3 M Ω/sq to 4 M Ω/sq.

The controller may control the substrate processing apparatus. The controller may control components of the substrate processing apparatus to perform a plasma processing process to be performed below. Furthermore, the controller may include a process controller including a microprocessor (computer) for executing control of the substrate processing apparatus, a user interface including a keyboard with which an operator performs a command input manipulation and the like to manage the substrate processing apparatus, a display visualizing and displaying an operation situation of the substrate processing apparatus, and the like, and a memory portion storing a control program for executing processing performed by the substrate processing apparatus under the control of the process controller, a program, that is, a processing recipe, for executing processing of each component according to various data and processing conditions, and the like. Furthermore, the user interface and the memory portion may be connected to the process controller. The processing recipe may be stored in a storage medium of the memory portion, and the storage medium may include a hard disk, a removable disc such as CD-ROM, DVD, and the like, or a semiconductor memory such as flash memory and the like.

Figure 3:
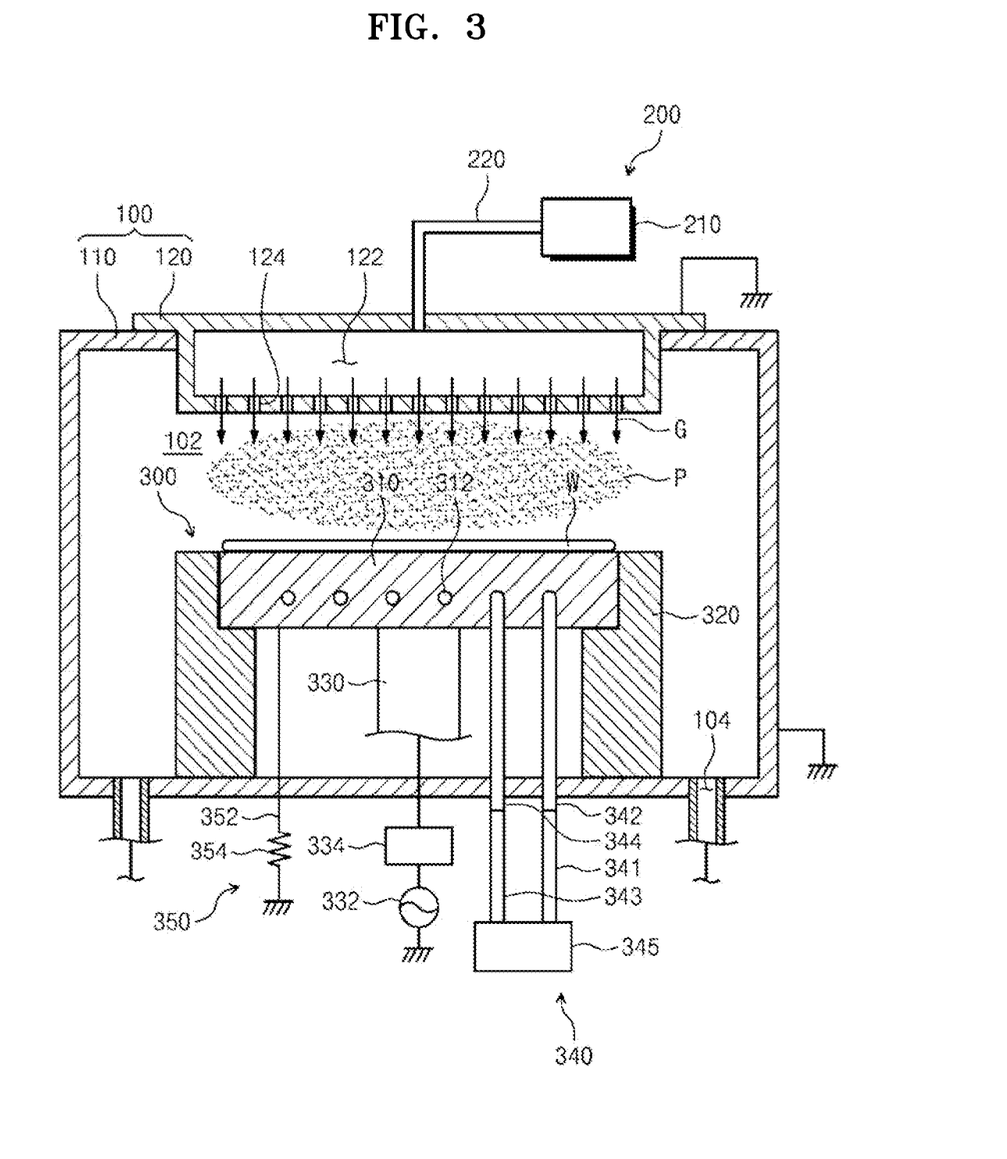
FIG. 3 illustrates a state in which the substrate processing apparatus of FIG. 2 processes a substrate.

FIG. 3 illustrates a state in which the substrate processing apparatus of FIG. 2 processes a substrate. Referring to FIG. 3, the substrate processing apparatus according to an embodiment of the present disclosure may perform a plasma processing process on the substrate W. When the substrate W is carried in the processing space 102 by a transfer robot and placed on the chuck 310, the gas supply unit 200 may supply the process gas G to the processing space 102. When the process gas G is supplied to the processing space 102, the power 332 may apply RF power to the chuck 310 to generate RF discharge in the processing space 102. The process gas G is excited by the RF discharge, and thus, the plasma P may be generated. The generated plasma P may be transferred to the substrate W to process the substrate W.

While the substrate W is processed, the temperature of the chuck 310 may be maintained constant at a set temperature. For example, the controller may control the temperature control member 340. The controller may control the temperature of the chuck 310 at the set temperature by controlling the temperature control member 340. The controller may control the temperature control member 340 based on a temperature value measured by a sensor (not shown) that measures the temperature of the chuck 310. The fluid supplied to the flow path 312 to control the temperature of the chuck 310 to be constant may have friction with the fluid line and generate static electricity. Part of the generated static electricity may be discharged to the outside through the first supply line 341 and/or the first collection line 343. However, as described above, as the second supply line 342 and the second collection line 344 are provided as an insulating material, the other part of the static electricity may not be discharged to the outside through the first supply line 341 and/or the first collection line 343, and may be transferred to the chuck 310. The static electricity transferred to the chuck 310 as above may be removed through the ground member 350.

Figure 4:
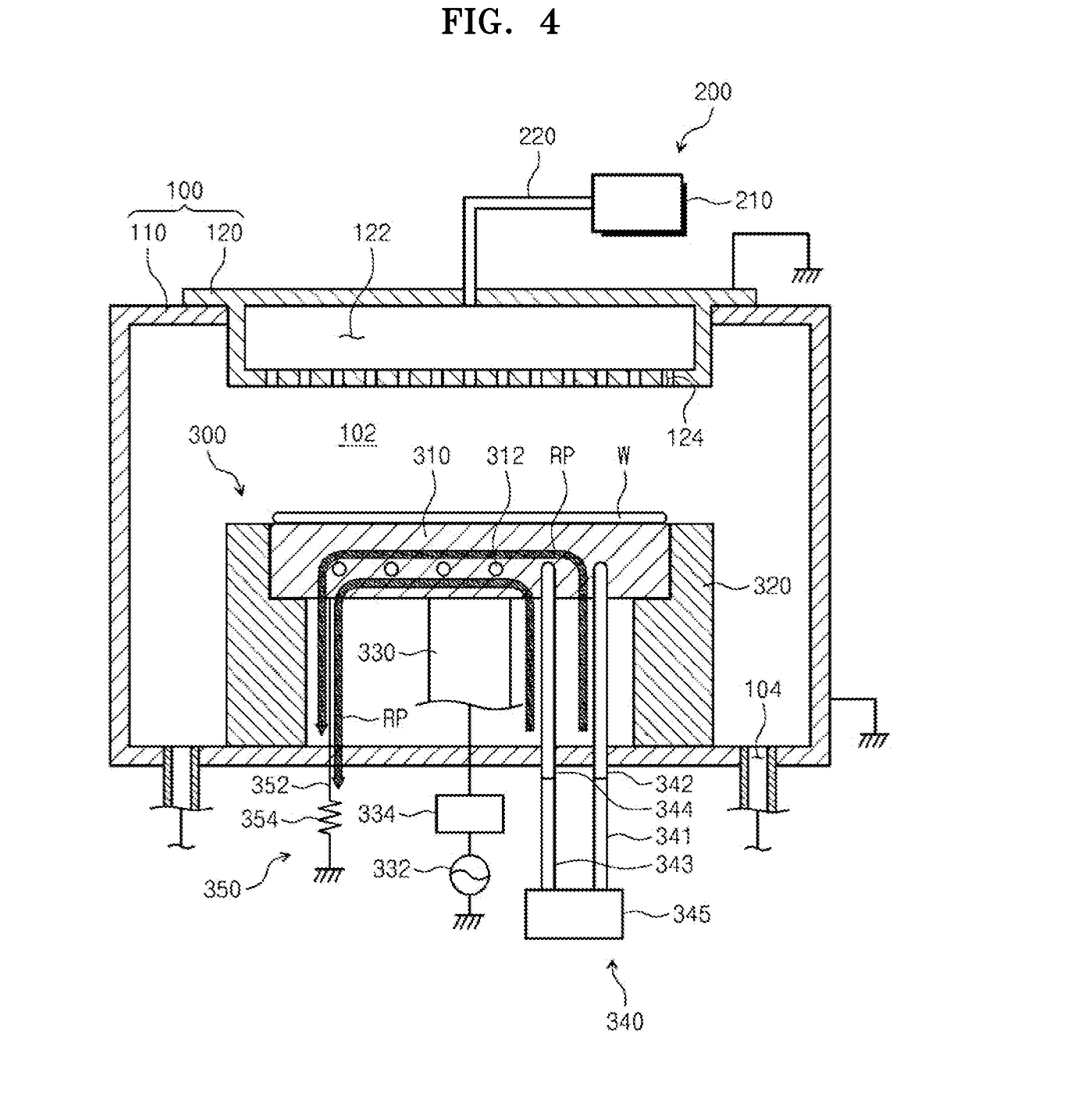
FIG. 4 illustrates a state in which a ground member of FIG. 2 forms an ionization path.

FIG. 4 illustrates a state in which a ground member of FIG. 2 forms an ionization path. Referring to FIG. 4, the ground member 350 may form an ionization path RP through which the static electricity transferred to the chuck 310 is discharged. As described above, as the amount of impedance that the ground member 350 has is less than the amount of impedance that the second supply line 342 and/or the second collection line 344 has, the static electricity transferred to the chuck 310 may be ionized through the ground member 350 having a relatively small impedance amount.

Figure 5:
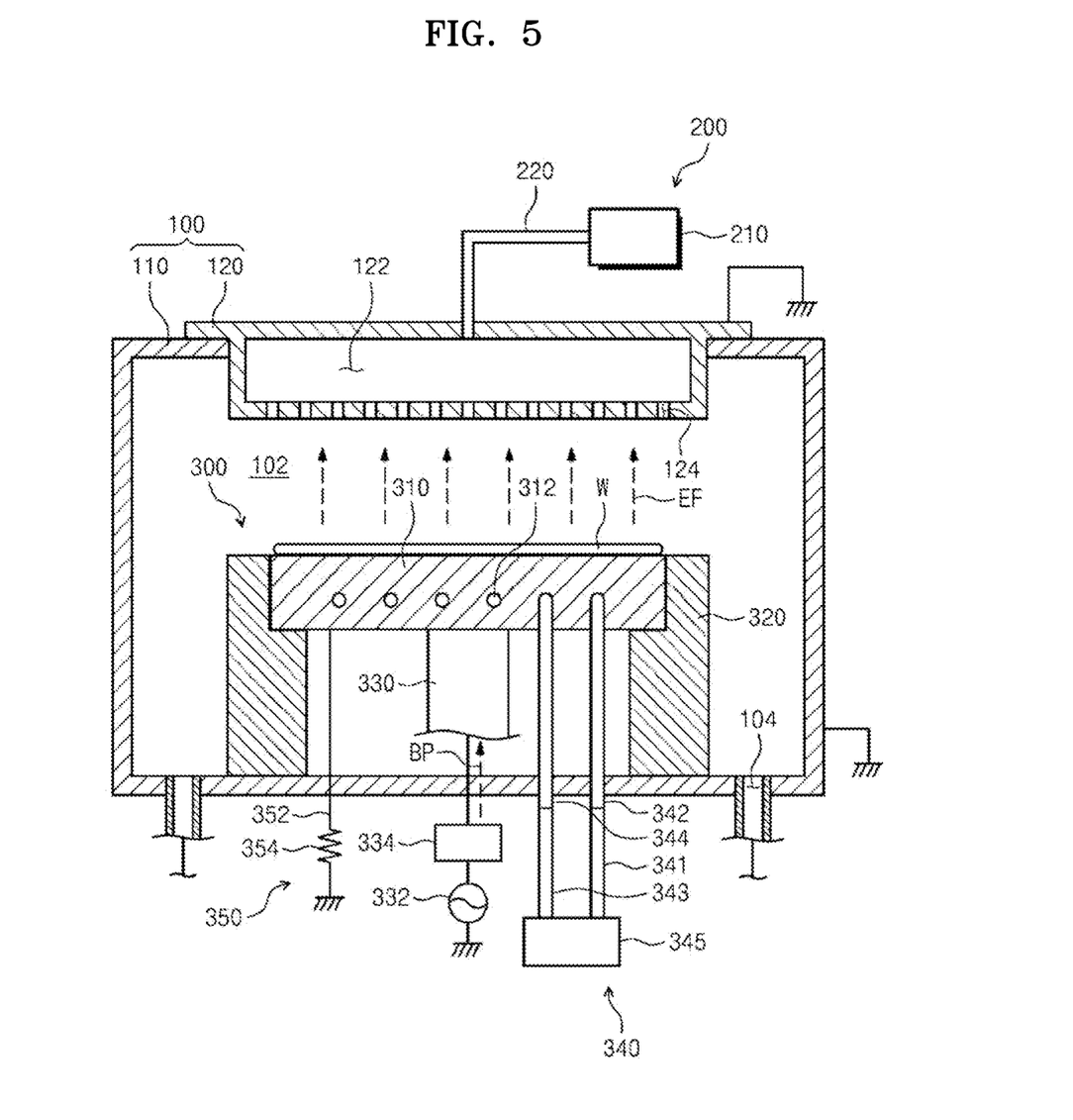
FIG. 5 illustrates a state in which a chuck of FIG. 2 generates RF discharge in a processing space of a chamber.

FIG. 5 illustrates a state in which the chuck of FIG. 2 generates RF discharge in the processing space of the chamber. When the ground line 352 forming an ionization path is connected to the chuck 310, the RF power (bias power, BP) applied by the power 332 is discharged in a direction toward the chamber 100 having impedance less than the ground member 350, thereby generating the plasma P. For example, the RF power (bias power, BP) applied by the power 332 is discharged in a direction toward the gas baffle 120 having impedance less than the ground member 350, thereby forming an electric field (EF). Accordingly, the plasma P may be generated from the process gas G. In other words, according to an embodiment of the present disclosure, while the ionization path RP is formed as the ground member 350 is connected to the chuck 310, as the ground member 350 is provided to have a large impedance, the loss of the RF power applied by the power 332 through the ground member 350 may be prevented as much as possible. Accordingly, while increasing the generation efficiency of the plasma P, the static electricity transferred to the chuck 310 may be effectively removed.

The detailed embodiments described above are intended to exemplify the present disclosure. Also, the content described above describes a preferred embodiment of the present disclosure, and the present disclosure maybe used in other various combinations, changes, and environments. In other words, changes or modifications are possible within the scope of the concept of the invention disclosed in this specification, the scope equivalent to the disclosure presented herein, and/or within the scope of technology or knowledge in the art. The embodiments described above are to describe the best mode for implementing the technical idea of the present disclosure, and various changes required in the specific application fields and uses of the present disclosure are possible. Accordingly, the detailed description of the disclosure presented above in the disclosed embodiments is not intended to limit the present disclosure. Also, the appended claims should be construed to include other embodiments as well.

The invention claimed is:

1. A substrate processing apparatus comprising:
a chamber defining a processing space;
a gas supply unit supplying a process gas to the processing space; and
a support unit supporting a substrate in the processing space,
wherein the support unit comprises:
  a chuck supporting the substrate;
  a power applying radio frequency (RF) power to the chuck; and
  a temperature control member controlling a temperature of the chuck;
wherein the temperature control member comprises:
  a fluid supply source supplying a fluid for controlling a temperature of the chuck;
  a supply line supplying the fluid from the fluid supply source to a flow path formed in the chuck; and
  a collection line returning the fluid from the flow path to the fluid supply source,
wherein the supply line comprises a first supply line connected to the fluid supply source and a second supply line connected to the chuck,
wherein the collection line comprises a first collection line connected to the fluid supply source and a second collection line connected to the chuck,
wherein the first supply line and the first collection line are electrically conductive and grounded to remove static electricity during fluid flow, and
wherein the second supply line and the second collection line are formed of an electrically insulating material to electrically isolate the chamber from the chuck.

2. The substrate processing apparatus of claim 1, further comprising a ground member having an impedance greater than an impedance of the chamber.

3. The substrate processing apparatus of claim 2, wherein the ground member comprises:
a ground line; and
a ground resistor installed on the ground line.

4. The substrate processing apparatus of claim 1, wherein an impedance of the second supply line is greater than an impedance of a ground member.

5. The substrate processing apparatus of claim 2, wherein the support unit further comprises an isolator surrounding at least part of the chuck and provided as an insulating material.

6. The substrate processing apparatus of claim 5, wherein the chamber further comprises:
a housing; and
a gas baffle combined with the housing to define the processing space, and in which at least one perforation is formed through which the process gas supplied by the gas supply unit passes.

7. The substrate processing apparatus of claim 6, wherein the gas baffle has an impedance that is less than an impedance of the ground member.

8. A support unit in a chamber for processing a substrate by using plasma, the support unit comprising:
a chuck supporting the substrate;
a power applying radio frequency (RF) power to the chuck;
a ground member forming an ionization path through which static electricity generated in the chuck is removed; and
a temperature control member controlling a temperature of the chuck
wherein the temperature control member comprises:
  a fluid supply source supplying a fluid for controlling a temperature of the chuck;
  a supply line supplying the fluid from the fluid supply source to a flow path formed in the chuck; and
  a collection line returning the fluid from the flow path to the fluid supply source,
wherein the supply line comprises a first supply line connected to the fluid supply source and a second supply line connected to the chuck,
wherein the collection line comprises a first collection line connected to the fluid supply source and a second collection line connected to the chuck,
wherein the first supply line and the first collection line are electrically conductive and grounded to remove static electricity during fluid flow, and
wherein the second supply line and the second collection line are formed of an electrically insulating material to electrically isolate the chamber from the chuck.

9. The support unit of claim 8, wherein the ground member has an impedance greater than an impedance of the chamber that defines a processing space in which the substrate is processed.

10. The support unit of claim 9, wherein the ground member comprises:
a ground line—the ground line being electrically connected to a ground—; and
a ground resistor on which the ground line is installed, and the ground resistor has an impedance greater than an impedance of the chamber.

11. The support unit of claim 10, wherein the ground resistor has a resistance of 3 M $\Omega$/sq to 4 M $\Omega$/sq.

* * * * *